United States Patent
Miyazawa

(10) Patent No.: US 8,647,163 B2
(45) Date of Patent: Feb. 11, 2014

(54) METHOD OF MANUFACTURING ORGANIC EL DISPLAY

(75) Inventor: Kazutoshi Miyazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 80 days.

(21) Appl. No.: 13/446,160

(22) Filed: Apr. 13, 2012

(65) Prior Publication Data

US 2012/0270460 A1    Oct. 25, 2012

(30) Foreign Application Priority Data

Apr. 15, 2011   (JP) .................. 2011-090778

(51) Int. Cl.
*H01J 9/50*    (2006.01)
(52) U.S. Cl.
USPC .......................................................... 445/2
(58) Field of Classification Search
USPC ................................. 445/2; 438/4
See application file for complete search history.

(56) References Cited

U.S. PATENT DOCUMENTS

| | | |
|---|---|---|
| 2004/0202777 A1 | 10/2004 | Nishikawa et al. |
| 2005/0215163 A1 | 9/2005 | Tamura et al. |
| 2006/0076555 A1 | 4/2006 | Liao et al. |
| 2006/0178072 A1 | 8/2006 | Konda |
| 2010/0062550 A1 | 3/2010 | Buchel et al. |
| 2010/0140644 A1 | 6/2010 | Kai et al. |
| 2011/0227104 A1 | 9/2011 | Miyazawa et al. |

FOREIGN PATENT DOCUMENTS

| | | |
|---|---|---|
| JP | 10-76384 | 3/1998 |
| JP | 2004-227852 | 8/2004 |
| JP | 2005-276600 | 10/2005 |
| JP | 2006-221982 | 8/2006 |
| JP | 2008-34264 | 2/2008 |
| JP | 2008-235178 | 10/2008 |
| JP | 2010-9998 | 1/2010 |
| JP | 4733235 | 4/2011 |
| WO | WO2010092749 | * 8/2010 |

* cited by examiner

*Primary Examiner* — Anh Mai
*Assistant Examiner* — Zachary J Snyder
(74) *Attorney, Agent, or Firm* — Panasonic Patent Center

(57) ABSTRACT

Laser light is irradiated onto a foreign substance, which is contaminated into an organic layer of an organic EL element, to insulate the periphery of the foreign substance, thereby repairing a defect of the organic EL element that may be caused by the foreign substance. Before the laser light is irradiated onto a pixel containing a foreign substance, the laser light is irradiated onto peripheral pixels around the pixel containing the foreign substance, while shifting a focal position of laser light. The focal position of laser light is defined based on a laser irradiation mark and an emission state of the pixel. The laser light is irradiated with the adjusted focus to insulate a foreign substance section without damaging other portions than the periphery of the foreign substance, thereby making it possible to repair a defect that may be caused by the foreign substance.

6 Claims, 14 Drawing Sheets

METHOD OF MANUFACTURING ORGANIC EL DISPLAY

CROSS REFERENCE TO RELATED APPLICATIONS

This application is entitled and claims the benefit of Japanese Patent Application No. 2011-090778, filed on Apr. 15, 2011, the disclosure of which including the specification, drawings and abstract is incorporated herein by reference in its entirety.

TECHNICAL FIELD

The present invention relates to a method of manufacturing an organic electroluminescent (EL) display. In particular, the invention relates to a method of manufacturing an organic EL display, which includes a process of repairing a defect that may be caused by a foreign substance that may be contaminated into an organic layer in a process of manufacturing the organic EL display.

BACKGROUND ART

Recently, flat-panel displays such as liquid crystal displays and plasma displays have been widely used. However, self-luminous organic EL displays comprising organic EL elements are expected to be the next-generation displays. An organic EL display provides a bright and clear image. Also, the organic EL display provides a wide viewing angle because it is a self-luminous type. In addition, the organic EL display has excellent properties such as rapid response characteristics. Also, the organic EL display has the advantage that the thickness of the display can be easily reduced, because it does not require a backlight. Therefore, the organic EL displays are expected to be widely used in large-screen TVs and the like, in the future.

The organic EL display includes a plurality of organic EL elements and a circuit board that is configured so that the organic EL elements are illuminated. In the circuit board, a thin film transistor (TFT) is connected to each organic EL element in order to control a current flowing through each organic EL element. Also, a correction circuit is connected to each organic EL element in order to suppress a variation in the current flowing through each organic EL element. An insulating layer is formed on the circuit board, and a laminated film having organic EL elements is formed on the insulating layer. In the insulating layer, a connection section is formed to connect the circuit board and each organic EL element.

The organic EL element is disposed on the insulating layer formed on the circuit board. On the insulating layer, positive electrodes and negative electrodes are provided in a matrix shape, and a plurality of organic layers are disposed between the positive electrodes and the negative electrodes. The organic layer includes a light emitting layer containing phosphor molecules, a hole conductive thin layer and an electron conductive thin layer disposed therebetween. When a voltage is applied between the positive electrode and the negative electrode of the organic EL element, holes are injected from the positive electrode into the hole conductive thin layer, and electrons are injected from the negative electrode into the electron conductive thin layer. The holes and electrons are combined in the light emitting layer, whereby light is emitted from the light emitting layer.

The organic EL element is protected by a sealing layer from external air, and is sealed by a sealing glass.

In a process of manufacturing the organic EL display, a process of forming the organic layer greatly influences the display performance. There are several types of methods of forming the organic layer. Among them, an ink-jet method is attracting attention. The ink-jet method applies (prints) a solution, which has an organic material dissolved with a solvent, onto necessary sites, dries the resulting structure, and evaporates the solvent of the solution to form the organic layer. By repeating applying and drying with respect to each organic material, the laminated film of the organic layer can be formed. According to the formation of the organic layer by the ink-jet method, it is easy to form the organic layer over the entire surface of the circuit board and also to make efficiency of the use of material. Therefore, a large-sized display can be relatively easily obtained. Also, the ink-jet method is suitable for manufacturing the display at a low cost.

When the laminated film of the organic layers is formed through the ink-jet method, it is necessary to deposit the organic layers while controlling the thickness of each of the organic layers with an accuracy of a few nm thickness. In the process of forming the organic layers, an ink-jet device is installed in a clean room, and an organic material is applied (printed) under clean environment so that the organic layer is prevented from being contaminated with foreign substances. However, the organic layer may be contaminated with foreign substances such as very fine particles, which are present in a device for applying an organic material or in the internal environment of the clean room. Thus, during the forming of the organic layer, it is difficult to completely prevent the organic layer from being contaminated with foreign substances. Accordingly, the produced organic display may include pixels having defects that are caused by the foreign substances contaminated into the organic layer.

When a voltage is applied between the positive electrode and the negative electrode of the organic EL element having the organic layer contaminated with foreign substances, a current leakage may occur between the electrodes through the foreign substances. Due to this current leakage, the amount of current flowing through the organic layer (light emitting layer) of a pixel including the foreign substances is reduced, and the brightness of the light emitting layer in the entire pixel is reduced. When the amount of current flowing between the electrodes is increased in order to suppress a decrease in brightness, an extra current is required. Also, the power consumption of the organic EL display is increased and the light emission efficiency is degraded. Alternatively, since the amount of leakage current due to foreign substances increases and causes local heating, a degradation of the organic layer may be caused by heat around the foreign substances. In some cases, a large amount of current flows through the foreign substances, no current flows through the organic layer, and the pixel with a foreign substance does not emit light.

A laser repair method has been known as a method of preventing a current leakage caused by foreign substances contaminated into the organic layer. The laser repair method is presented in which a portion of the organic layer which is contaminated with foreign substances or around the portion is irradiated with laser light, thereby a current leakage that may be caused by the foreign substances is prevented. The laser repair method is presented in which a foreign substance or around the foreign substance is irradiated with laser light to insulate the periphery of the foreign substance and a part of the electrode located at the portion contaminated with the foreign substance, thereby a current leakage that may be caused by the foreign substance can be prevented.

For example, Patent Literature 1 describes a method of irradiating an organic layer containing a foreign substance with femtosecond laser light, and thus causing a multi-photon absorption to only a portion having the foreign substance. FIG. 11(a) is a cross-sectional view illustrating the state irradiating foreign substance 10 with femtosecond laser light. FIG. 11(b) is a top view of the state in FIG. 11(a). As illustrated in FIG. 11, a foreign substance is irradiated with a laser light 12 at an adjusted focus of laser light 12. Only a portion around the contaminated foreign substance is insulated by laser light without damaging the periphery of the foreign substance, thereby preventing the occurrence of a leakage current that may be caused by the foreign substance.

Also, Patent Literature 2 describes a method of using a laser to remove an electrode on the periphery of a foreign substance, which surrounds the periphery of the foreign substance, without directly irradiating with laser light an organic layer containing the foreign substance. FIG. 12(a) is a cross-sectional view illustrating the state irradiating with laser light an electrode on the periphery of a foreign substance. FIG. 12(b) is a top view of the state in FIG. 12(a). Negative electrode 5 on periphery of the foreign substance 11 is removed by laser light 12, therefore a foreign substance is not directly irradiated with laser light 12. As a result, the occurrence of a current leakage can be prevented by insulating periphery of the foreign substance 11 without damaging the foreign substance.

Also, Patent Literature 3 discloses a method of irradiating with low-energy laser light a portion of an organic layer around the contaminated foreign substance, without directly irradiating with laser light the foreign substance. FIG. 13 is a top view illustrating a state where the periphery of a foreign substance is irradiated with weak laser light. As illustrated in FIG. 13, when periphery 22 of foreign substance 10 is irradiated with laser light, the energy of the laser light is transmitted from an irradiated region to a defective section. This cycle is repeated several times (four times, irradiation 1 to 4 in FIG. 13) to form high-resistance region 21 around foreign substance 10. No current flows through high-resistance region 21. Thus, a current leakage from a positive electrode to a negative electrode via a foreign substance can be prevented by irradiating with low-energy laser light the periphery of the foreign substance.

What has also been known is a technology to repair a defective pixel by irradiating with laser light a foreign substance, the periphery of the foreign substance, or a transparent electrode (see Patent Literatures 4 to 10).

As described in Patent Literatures 1 to 10, when a foreign substance is contaminated into an organic layer to cause a defect, a foreign substance or the periphery of the foreign substance is irradiated with laser light so as to insulate a laser-irradiated section, thus enabling to prevent a current leakage of a defective section, that is, to repair a defective component. However, Patent Literatures 1 to 3 do not describe a method of adjusting the focal position of the irradiation laser light. If the laser irradiation position is not accurate, a defect is formed by the irradiation of laser light.

For example, in the method described in Patent Literature 1, if the focal position of laser light for irradiating an organic layer is misaligned, the organic layer may be damaged and destroyed. Also, a foreign substance may be finely dispersed by the irradiation of laser light onto a foreign substance, thus causing an increase in leakage current.

Also, in the method described in Patent Literature 2, because the focus of laser light is not properly adjusted, there is a possibility that the focus may be misaligned on the organic layer disposed under the electrode. In this case, an organic layer may be irradiated with laser light, thus causing a degradation of the organic layer. Also, if a sealing layer is formed on the electrode, the sealing layer may be irradiated with laser light, thus degrading the sealing layer and causing a defect in the pixel irradiated with the laser light.

Also, in the method described in the Patent Literature 3, as in the method described in Patent Literature 2, because the focus of laser light is not properly adjusted, a sealing layer or an organic layer formed near an electrode may be irradiated with the laser light, thus damaging the organic layer or the sealing layer and causing a defective pixel.

As a method of adjusting the focal position of laser light, as described in Patent Literature 11, there has been a method of determining the focal position of laser light by forming a process pattern by irradiating with the laser light a process target material while changing the distance between the process target material and a laser head. In Patent Literature 11, line-shaped grooves are formed by irradiating with laser light the process target material while changing the distance between the process target material and the laser head. FIG. 14 illustrates a state where groove 101 is formed on a process target material by irradiating with laser light while changing the distance between the process target material and a laser head. Along a direction of arrow 100, a plurality of groove 101 is formed. As illustrated in FIG. 14, after process patterns (line-shaped grooves 101) are formed at intervals of the distance between the process target material and the laser head, a capacitive sensor attached to the laser head is used to measure a change in capacitance to determine the focal position of laser light.

Also, as a method of adjusting the focal position of laser light, there has been proposed a method of setting the focal position of laser light by measuring the return time of the laser light reflected by a reflective layer of an organic EL equipment (Patent Literature 12).

CITATION LIST

Patent Literature

PTL 1: Japanese Patent Application Laid-Open No. 2008-235178
PTL 2: Japanese Patent Application Laid-Open No. 2005-276600
PTL 3: Japanese Patent Application Laid-Open No. 2004-227852
PTL 4: Japanese Patent Application Laid-Open No. 2008-34264
PTL 5: Japanese Patent Application Laid-Open No. 2006-221982
PTL 6: U.S. Patent Application Publication No. 2006/0178072
PTL 7: Japanese Patent No. 4733235
PTL 8: U.S. Patent Application Publication No. 2006/0076555
PTL 9: U.S. Patent Application Publication No. 2010/0062550
PTL 10: U.S. Patent Application Publication No. 2010/0140644
PTL 11: Japanese Patent Application Laid-Open No. 1998-076384
PTL 12: Japanese Patent Application Laid-Open No. 2010-9998

SUMMARY OF INVENTION

Technical Problem

However, the method described in Patent Literature 11 is a method of adjusting the laser focal position on a typical process target material, which is a method of adjusting the laser focal position on the surface of a process target material. In laser repair of an organic EL display, it is necessary to adjust the focal position of laser light on an electrode or a foreign substance in the display. Accordingly, the method according to Patent Literature 11 cannot be applied. Also, it is difficult to adjust the laser focal position in consideration of the damage of a laser irradiating section formed by irradiating with laser light. The method described in Patent Literature 12 is complicated because it is necessary to provide an organic EL element with a reflective layer.

In order to solve the conventional problems described above, the invention is to provide a method of manufacturing an organic EL display, which can repair a defect without damaging an organic layer, a sealing layer, and the like, by adjusting the focal position of laser light in laser-repairing that repairs a defective section caused by a foreign substance contaminated into an organic EL element of an organic EL display.

Solution to Problem

In order to achieve the above object, a method of manufacturing an organic EL display according to the invention includes: a first step of detecting a dead pixel in a panel of an organic EL display after preparing the organic EL display; a second step of detecting a foreign substance in the dead pixel; a third step of irradiating a pixel X around the dead pixel with laser light so as to define a focal position of the laser light on a transparent electrode in the panel; and a fourth step of irradiating the foreign substance in the dead pixel or a portion around the foreign substance with a laser light at the defined focal position.

Also, in the third step of the method of manufacturing the organic EL display, the pixel X is irradiated with the laser light while reducing a gap between an objective lens of for the laser light and the pixel X so as to form a laser irradiation mark in the pixel X. And further, in the pixel X which emit light and has the laser irradiation mark, a diameter of a non-luminous region generated by irradiating with the laser light is equal to or 1.5 times smaller than a diameter of the laser irradiation mark at a gap between the objective lens and the pixel, the gap being defined as the focal position of the laser light.

Advantageous Effects of Invention

According to a method of manufacturing an organic EL display of the invention, when a defect is repaired by irradiating with laser light an electrode of an organic EL element having an organic layer contaminated with a foreign substance or a portion near the electrode, the focal position of the irradiation laser light is adjusted on a transparent electrode. Accordingly, by the laser repair, organic EL displays can be manufactured at a high yield rate.

DESCRIPTION OF EMBODIMENTS

Hereinafter, embodiments of the invention will be described with reference to the drawings.

1. Method of Manufacturing Organic EL Display of the Invention.

Figure 1:
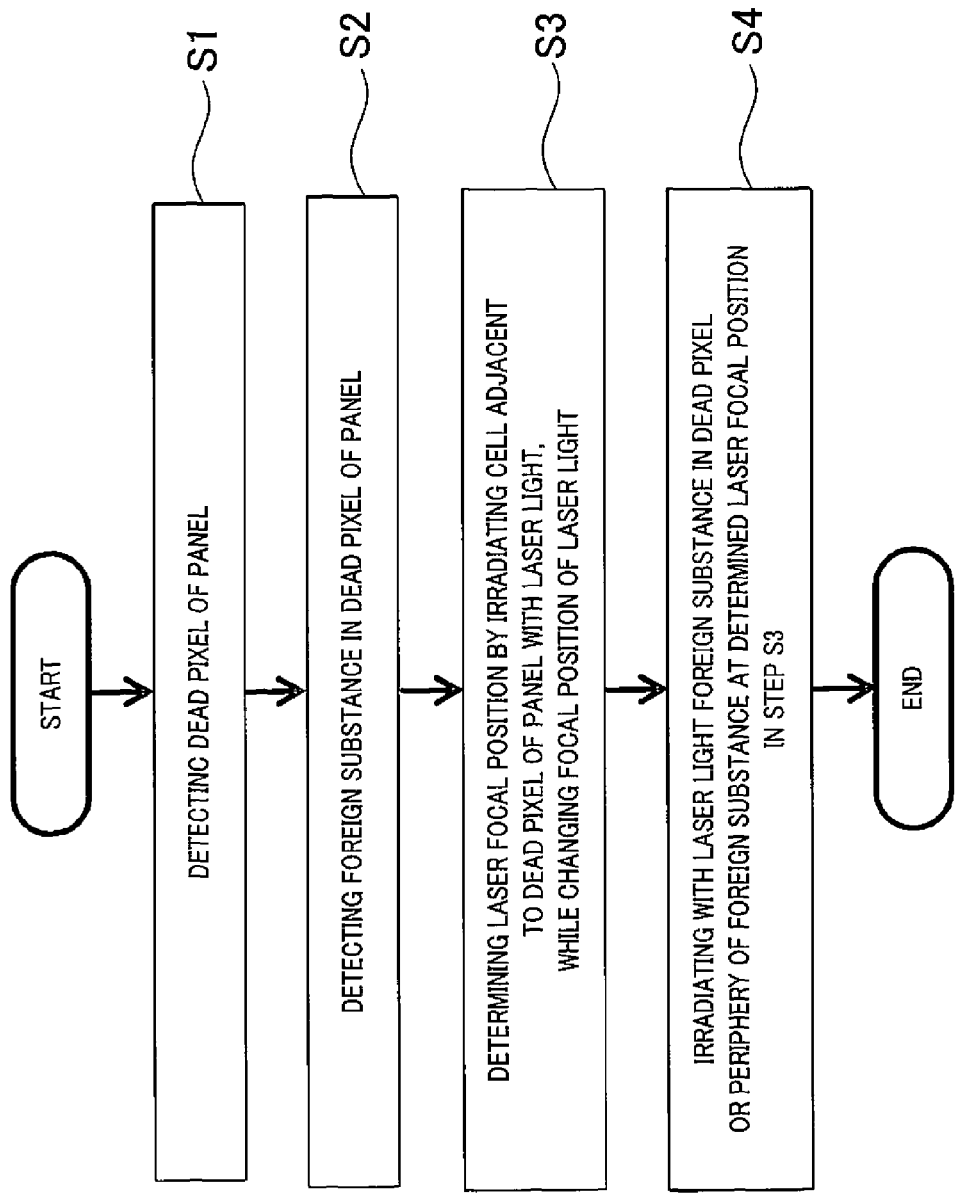
FIG. 1 is a flow chart illustrating a method of manufacturing an organic EL display according to the invention.

As illustrated in the flow chart of FIG. 1, a method of manufacturing an organic EL display according to the invention includes: a first step (S1) of detecting a dead pixel in a panel of an organic EL display after preparing the organic EL display; a second step (S2) of detecting a foreign substance in the dead pixel in the panel detected in the first step; a third step (S3) of irradiating with laser light pixels around the dead pixel detected in the first step so as to define a focal position of the laser light; and, a fourth step (S4) of irradiating with laser light the foreign substance in the dead pixel detected in the second step or onto a portion around the foreign substance with the defined focal position of the laser light.

The respective steps will be described below in detail. In the first step (S1), after an organic EL display panel is fabricated, the panel is illuminated, and a pixel including a non-luminous dark point (dead pixel) is extracted. A method of detecting the dead pixel is not specifically limited. There is a method of: illuminating the panel; recording an image of the illuminating panel by a high-resolution camera, a high-sensitivity camera, or the like; and, extracting an image of the dead pixel from the recorded image of the illuminating panel.

Examples of the high-sensitivity cameras include an accumulation-type high-sensitivity camera such as a cooled CCD camera, and a double-type high sensitivity-camera such as an EMCCD camera. Also, the dead pixel may be extracted using a pattern inspecting device. A pattern inspecting method includes a "Die to Die inspecting method" in which a foreign substance can be detected by comparing adjacent pixels each other, and a "Die to Database inspecting method" in which a foreign substance can be detected by comparing pixels and design data. Also, a microscope may be used simply to visually observe an illuminating panel and extract the dead pixel. One of the above methods may be used to detect the position of the dead pixel in the panel.

In the second step (S2), a foreign substance, which is present in the dead pixel, is detected. A method of detecting the foreign substance is not specifically limited. The foreign substance in the dead pixel may be detected by observation based on high-sensitivity cameras or by a pattern inspecting device described in the first step 1. Also, if a fine foreign substance is to be detected, it is preferable that the inspection is performed by microscope observation in a dark vision, by a white interference measurement method, or by a laser microscope. By these methods, the location of a foreign substance in the dead pixel is determined.

Figure 2:
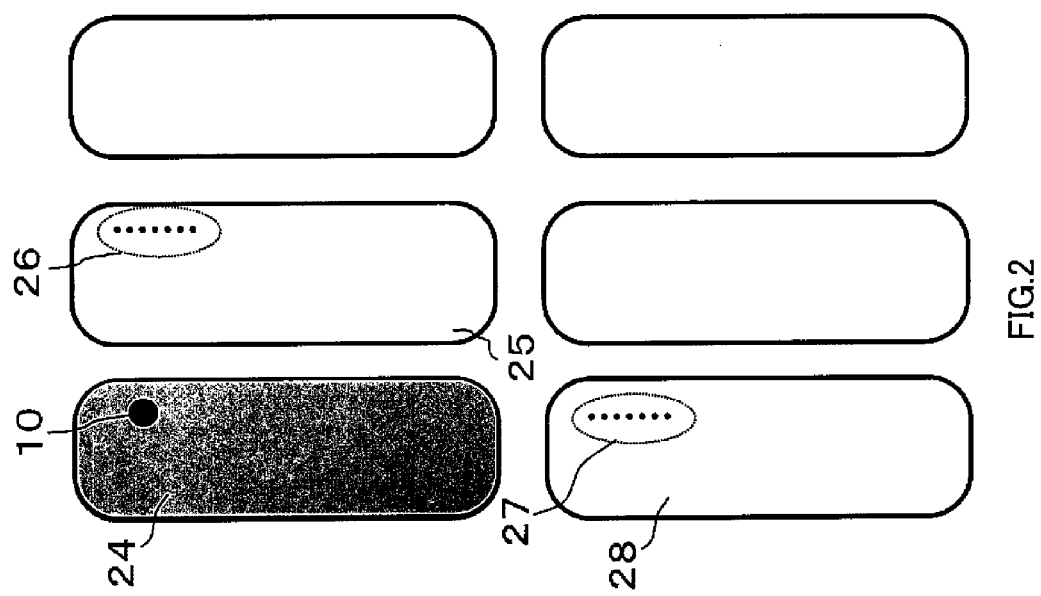
FIG. 2 is a diagram illustrating a dead pixel and a normal pixel around the dead pixel.

In the third step (S3), the focal position of laser light is adjusted by irradiating with laser light normal pixel (non-dead pixel) around the dead pixel detected in the first step. FIG. 2 illustrates a dead pixel and normal pixels around the dead pixel.

As illustrated in FIG. 2, the pixel irradiated with laser light may be pixel 25 that is laterally adjacent to dead pixel 24, or may be pixel 28 that is longitudinally adjacent to dead pixel 24. It is preferable that a portion irradiated with laser light in pixel 25 or pixel 28 is portion 26 or 27 which is the same as the portion of foreign substance 10 in dead pixel 24. A thickness of an organic layer at a predetermined position in each of pixels has an approximate value. Accordingly, even when the thickness of an organic layer of an organic EL element is non-uniform, the focal position of laser light can be more accurately adjusted by irradiating with laser light the same position in a pixel as the position of the foreign substance. Alternatively, because a laser-irradiated region becomes a non-luminous region, an edge spaced apart from the center of the pixel may be irradiated with laser light so that a non-luminous region is inconspicuous.

A pixel is irradiated with laser light through a color filter. Therefore, it is necessary that the laser light has a wavelength of light passing the color filter. Thus, if the organic EL element has a general color filter including R, G, and B, it is preferable to select laser light having a wavelength of 800 nm or more. For example, a flash lamp-pumped Nd:YAG laser light having a fundamental wavelength of 1,064 nm can be selected as the laser light.

Also, it is preferable to use laser light with a short-pulse width in order to minimize damage to a part irradiated with laser light in a pixel. For example, a picosecond laser and a femtosecond laser, which have wavelength of 800 nm or more and a narrower wavelength than that of a YAG laser, are preferable to the YAG laser. As the pulse width is short, the laser irradiation time is short, so that a thermal damage in laser irradiation is suppressed.

Because the preferable energy density of the irradiation laser light can be determined according to the thickness and material of an organic layer, the energy density of the irradiation laser light may be set suitably so that a laser irradiation mark is formed by irradiation of laser light.

First, an objective lens and a pixel to be irradiated with laser light are spaced apart from each other by a distance at which a laser irradiation mark is not formed even when the pixel is irradiated with laser light. The laser irradiation mark is a mark formed by irradiating with laser light that can be viewed even when the pixel is not illuminated.

Next, the distance between the objective lens and the pixel is reduced by 1 μm, and an irradiation target section in the pixel is irradiated with laser light. After irradiation of laser light, the distance between the objective lens and the pixel is further reduced by 1 μm, and another irradiation target section in the pixel is irradiated with laser light. While sequentially reducing the distance between the objective lens and the pixel, irradiations of laser light are iteratively conducted to form a plurality of dot-shaped laser irradiation marks along a line. The irradiation of laser light is conducted while reducing the distance between the objective lens and the pixel until a laser irradiation mark is not formed even when an irradiation of the laser light is conducted. The distance, by which the gap between the objective lens and the pixel is reduce each time, may not be 1 μm and may be set suitably.

Also, while sequentially reducing the distance between the objective lens and the pixel, the irradiation of laser light may be conducted to form a line-shaped laser irradiation mark.

After the laser irradiation mark is formed by irradiation of laser light, the pixel is illuminated. The illuminating state of a region (laser irradiation mark) irradiated with laser light is observed by a microscope or the like. The section with a laser irradiation mark becomes a non-luminous region since a part of a negative electrode of the pixel and a periphery portion thereof are made electrically-high-resistance by processing with laser light irradiation or a part of the organic layer near the part of the negative electrode is degraded. Because the pixel is irradiated with the laser light while changing the focal position of laser light, the area of a non-luminous region is not constant. For example, the area of the non-luminous region tends to change such that: the area of the non-luminous region is increased by two or more times in comparison with the area of laser irradiation mark from the area which is nearly equal to that of the laser irradiation mark when the gap between the objective lens and the pixel is reduced; and then, the area of the non-luminous region becomes smaller by further continuously reducing the gap.

The focal position of laser light shifts from the negative electrode of the pixel to the organic layer thereunder by reducing the gap between the objective lens and the pixel. Therefore, the damage of the organic layer becomes larger and the area of the non-luminous region is increased while reducing the gap between the objective lens and the pixel. In a case when the objective lens further approaches to the pixel, the focal position of laser light further shifts to a layer under the organic layer. Therefore, the damage to the organic layer is reduced, the area of the non-luminous region is reduced, and the non-luminous region becomes small.

Figure 3:
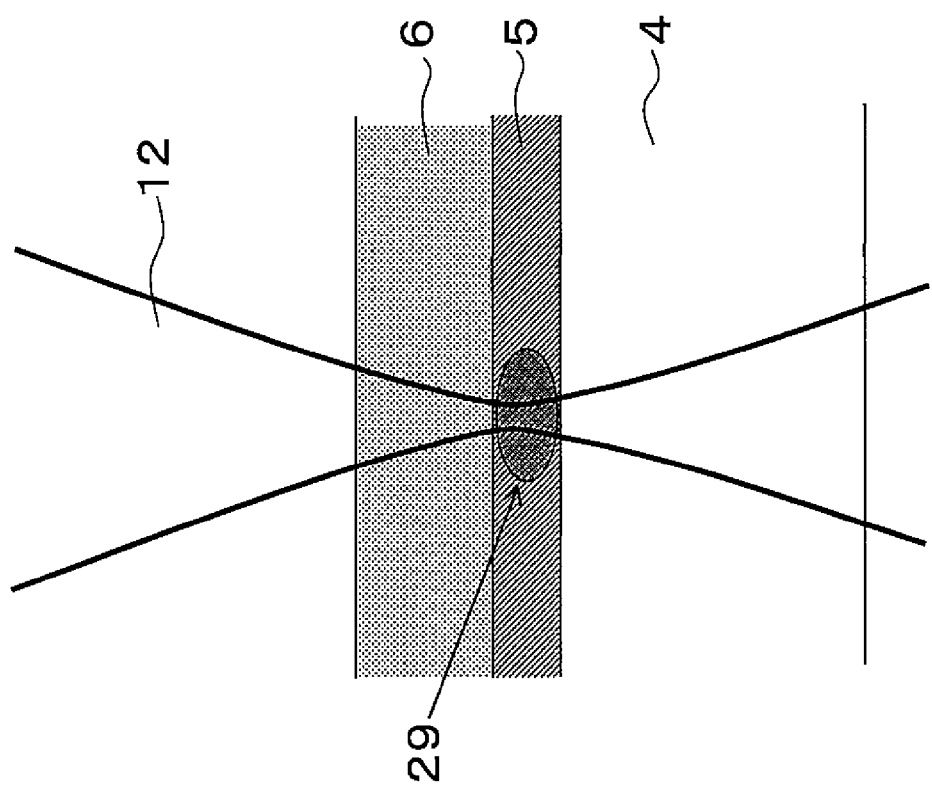
FIG. 3 is a diagram illustrating a state where the focal position of laser light is adjusted on the position of an electrode.

FIG. 3 illustrates a state where laser focal position 29 of laser light 12 is adjusted on negative electrode 5. When the focal position of irradiation laser light is adjusted on the negative electrode, the negative electrode can be insulated without damaging other layers such as the organic layer.

While sequentially reducing the gap between the objective lens and the pixel, the irradiation of laser light is intermittently conducted to form dot-shaped laser irradiation marks.

Thereafter, the pixel is illuminated. When observing the state of dot-shaped non-luminous regions formed by laser irradiation, it is observed that the area of the non-luminous region is suddenly increased. It is experimentally confirmed that the diameter of the non-luminous region is suddenly increased from the diameter that is nearly equal to the diameter of the dot-shaped laser irradiation mark formed by laser processing, when the gap between the objective lens and the pixel is intermittently reduced. Specifically, it is confirmed that a non-luminous region having a diameter larger by 1.5 times than the diameter of the dot-shaped laser irradiation mark formed by laser processing is generated when the gap between the objective lens and the pixel is reduced.

Also, the experiment result reveals that a non-luminous region having a diameter equal to or smaller by 1.5 times than the diameter of the dot-shaped laser irradiation mark formed by irradiation of laser light is indistinctive for observer. Such a non-luminous region is indistinctive for observer apart from the EL display. Because, there is a distance between the EL layer and the negative electrode and a light is dispersed from the organic layer with a certain angle, therefore an overlap between the light emissions around the non-luminous region is occurred.

Thus, if the diameter of the non-luminous region is equal to or smaller by 1.5 times than the diameter of the dot-shaped laser irradiation mark, it is determined that the focal position of laser light is adjusted on only a negative electrode section, and the negative electrode is processed by irradiation of laser light without damaging other regions such as the organic layer. If the diameter of the non-luminous region is increased over 1.5 times larger than the diameter of the dot-shaped laser irradiation mark, or if the area of the non-luminous region is an area contracting after increasing, it is determined that the focal position of laser light is adjusted on the location other than the negative electrode. When the focal position of laser light is adjusted in this manner, the irradiation of laser light damages the organic layer and other regions, thus degrades the organic EL element.

Figure 4:
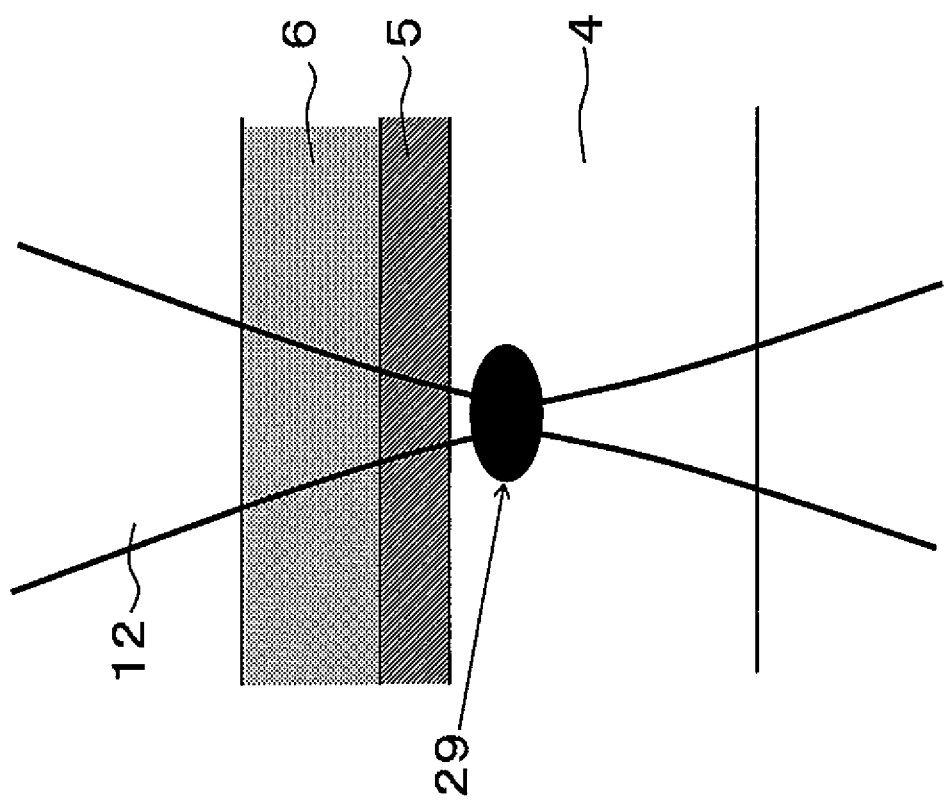
FIG. 4 is a diagram illustrating a state where the focal position of laser light is adjusted on an organic layer instead of being adjusted on an electrode.

FIG. 4 illustrates a state where laser focal position 29 is adjusted on organic layer 4 instead of negative electrode 5. In this state, damage is given to organic layer 4. Thus, organic layer 4 is degraded, that is, the area of a non-luminous region is increased.

In this manner, a focal position of laser light is adjusted by determining conditions so that the focal position of laser light is adjusted on only the negative electrode in a pixel around the dead pixel.

In the fourth step (S4), the foreign substance in the dead pixel detected in the second step or a portion around the foreign substance in the pixel is irradiated with laser light. When a foreign substance is irradiated with laser light, the foreign substance may be damaged by the laser light irradiation. Therefore, there is a possibility that the foreign substance is destroyed, and a defective section may be widened. Thus, it is preferable that the periphery portion of of the foreign substance is irradiated with laser light. If the laser light is a focused laser light, a stage on which the organic EL element is placed is shifted and the dead pixel is processed so as to render the periphery of the foreign substance with laser light. In the case of slit processing using a laser optical system including a rectangular-shaped slit and an imaging lens, irradiation of laser light through the slit may be performed several times so that the foreign substance is surrounded by rectangular-shaped laser irradiation marks. Also, a portion around the foreign substance may be processed at a time by irradiating with laser light through a mask instead of the slit, the mask having a pattern such that irradiation of laser light is conducted in belt-shape. Also, if the size of a foreign substance is about several µm, such a fine foreign substance may be irradiated with laser light.

When a foreign substance or a portion around the foreign substance is irradiated with laser light, the focal position of laser light may be adjusted on the focal position of laser light adjusted in the third step, that is, the focal position of laser light may be adjusted on the negative electrode (transparent electrode). If there is a plurality of foreign substances, the respective foreign substances may be iteratively irradiated with laser light.

After irradiating with laser light a foreign substance or a portion around the foreign substance in the dead pixel, the dead pixel is illuminated and it is confirmed whether the dead pixel illuminates. As in the method of detecting the dead pixel in the panel in the first step, whether the dead pixel again illuminates may be confirmed by observation through a high-resolution camera, a high-sensitivity camera or by pattern inspection. Also, it may be confirmed by a microscopic observation.

Because the foreign substance in the dead pixel is irradiated with laser light at a focal position adjusted on the negative electrode, only a part of the negative electrode is damaged or degraded into an electrically-high-resistance state. Thus, re-emission of light must be detected because a current leakage by the foreign substance is not generated. At this time, if re-emission of light is not detected, the second step is performed again to determine whether the foreign substance present in the dead pixel is overlooked. If the foreign substance is detected, irradiation of laser light is conducted in the same manner as in the fourth step.

In the method of manufacturing the organic EL display according to the invention, the positions of the negative electrode and the positive electrode may be reversed.

Also, although it is described that irradiation of laser light is conducted while gradually reducing the gap between the objective lens and the pixel, the invention is not limited thereto. For example, irradiation of laser light may be conducted while gradually increasing the gap between the objective lens and the pixel.

2. Organic EL Display of the Invention

An organic EL display of the invention is the organic EL display manufactured by the above described method of manufacturing an organic EL display of the invention. The organic EL display of the invention is a top-emission type, and includes a circuit board and organic EL elements that are disposed in a matrix configuration on the circuit board.

Figure 5:
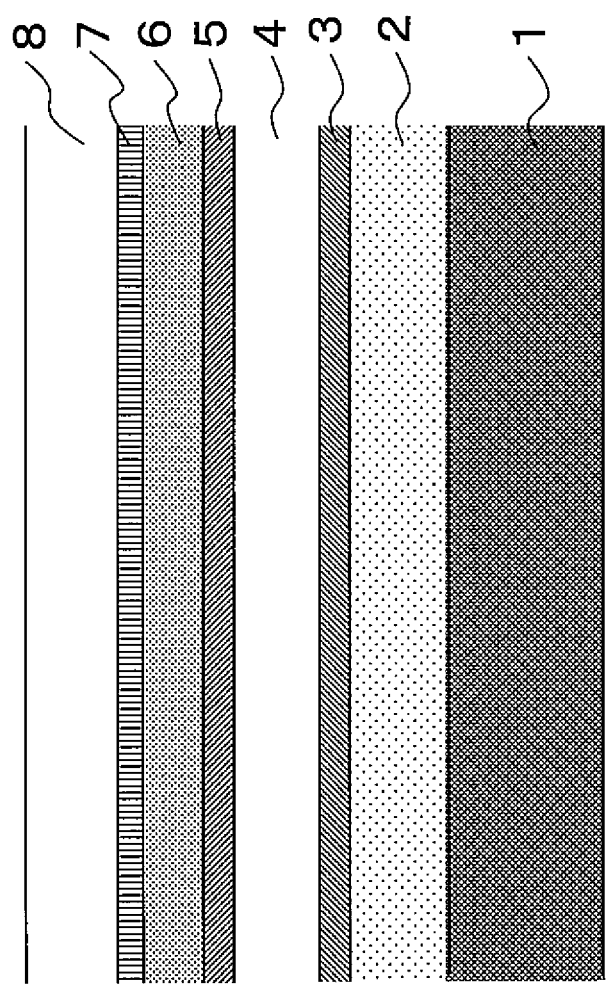
FIG. 5 is a cross-sectional view of an organic EL display.

As illustrated in cross-sectional view of FIG. 5, the organic EL element includes circuit board 1 including a driving circuit, insulating layer 2 disposed on circuit board 1, positive electrode 3 disposed on insulating layer 2, organic layer 4 disposed on positive electrode 3, transparent negative electrode 5 disposed on organic layer 4, sealing layer 6 disposed on transparent negative electrode 5, and color filter 7 disposed on sealing layer 6. The organic EL element may include a bank that defines organic layer 4. Also, the organic EL display is sealed by sealing glass 8 further disposed on color filter 7.

Circuit board 1 may be an insulating board. Also, the circuit board may include a thin film transistor (TFT) connected to each pixel. Each TFT installed in the circuit board is insulated. Each pixel is connected to the TFT through a contact hole.

The positive electrode is a conductive member disposed on circuit board 1. Also, it is preferable that the positive electrode have optical reflectivity. Examples of the materials for the positive electrode include APC alloys (an alloy of silver, palladium and copper), ARA alloys (an alloy of silver, rubidium and gold), MoCr (an alloy of molybdenum and chromium), and NiCr (an alloy of nickel and chromium). Also, positive electrode 3 may be connected to a TFT electrode through a contact hole.

Organic layer 4 includes an organic light emitting layer containing an organic light emitting material. The organic light emitting material is preferably a polymer organic light emitting material that may be formed by a coating method. Examples of the polymer organic light emitting material include polyphenylene vinylene and derivatives thereof, polyacetylene and derivatives thereof, polyphenylene and derivatives thereof, poly-para-phenylene ethylene and derivatives thereof, poly 3-hexyl thiophene and derivatives thereof, and polyfluorene and derivatives thereof. Also, the organic light emitting layer emits any one of red light, green light, or blue light according to the disposition of the pixels in the organic EL element. Organic layer 4 may further include a hole injection layer, an intermediate layer, and an electron transport layer.

Figure 6:
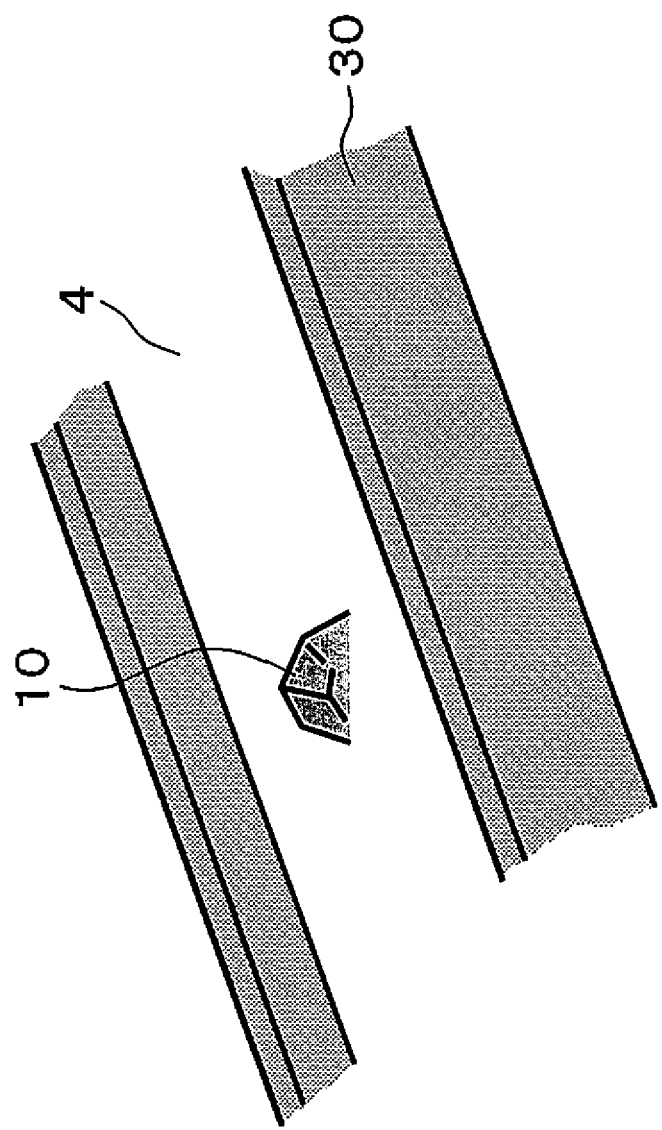
FIG. 6 is a perspective view illustrating a state where a foreign substance is contaminated into an organic layer in a process of manufacturing an organic EL display.
Figure 7:
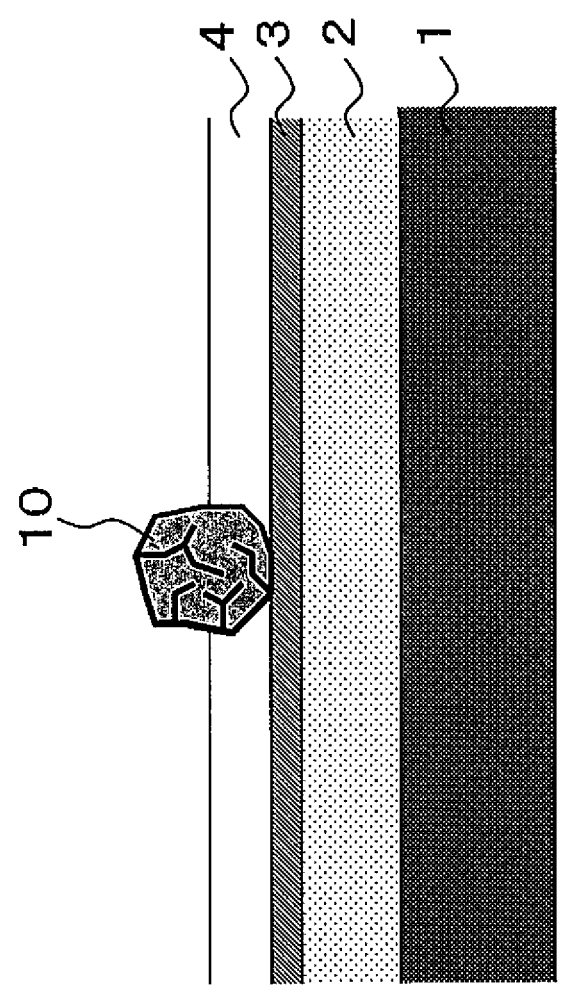
FIG. 7 is a cross-sectional view illustrating a state where a foreign substance is contaminated into an organic layer in a process of manufacturing an organic EL display.

As illustrated in the perspective view of FIG. 6 and the cross-sectional view of FIG. 7, foreign substance 10 may be contaminated into organic layer 4 when organic layer 4 is formed. Bank 30 is an insulating barrier that defines organic layer 4. The bank may be formed by patterning a resist material, that is a photosensitive material, by exposure and development.

Negative electrode 5 is a conductive transparent member disposed on organic layer 4. Examples of the materials for the transparent negative electrode include ITO, IZO, and the like.

Sealing layer 6 is a member that protects the organic layer from water and oxygen. Examples of the materials of the sealing layer include inorganic materials such as a silicon nitride (SiNx) and organic materials such as UV curable resin.

Color filter 7 is a layer that selectively extracts only a specific wavelength of light among the light emitted from organic layer 4. The light emitted from organic layer 4 passes the color filter, thus making it possible to achieve high color reproducibility. The color of color filter 7 may be selected suitably according to the color generated by the organic EL element. Specifically, the organic EL element having an organic layer emitting red light includes a red color filter. The organic EL element having an organic layer emitting green light includes a green color filter. The organic EL element having an organic layer emitting blue light includes a blue color filter. Examples of the materials for the color filter include color resist. Also, color filter 7 has a thickness of about 1 μm.

Hereinafter, embodiments of methods of manufacturing organic EL displays of the invention will be described with reference to the drawings. In the embodiments, a detailed description will be given of the third step (the step of adjusting the focal position of laser light to insulate a portion around a foreign substance), which is performed after illuminating the above organic EL display, extracting a dead pixel, and detecting a foreign substance in the dead pixel.

Embodiment 1

Figure 8:
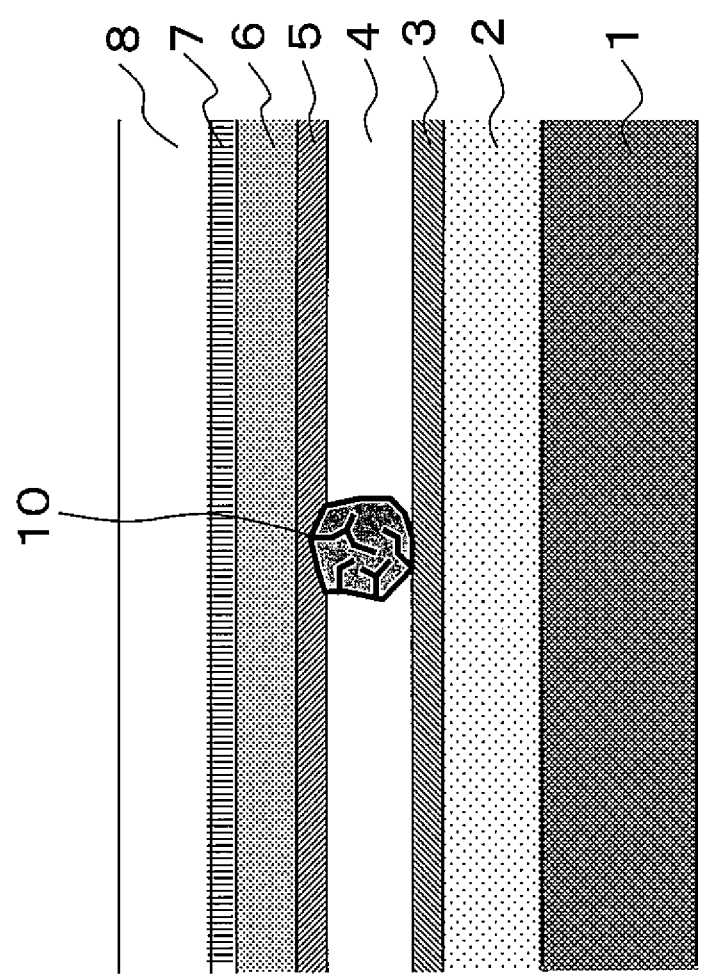
FIG. 8 is a cross-sectional view of an organic EL display having a foreign substance contaminated into an organic layer.

FIG. 2 is a diagram illustrating dead pixel 24, adjacent pixel 25 and adjacent pixel 28, adjacent pixels 25, 28 being normal pixels adjacent to dead pixel 24. As illustrated in FIG. 2, a dead pixel, which is a pixel having a non-luminous dark point, is detected in the first step. As illustrated in the cross-sectional view of FIG. 8, foreign substance 10 is contaminated into the dead pixel.

In the third step, in order to damage a negative electrode or increase the electrical resistance of the negative electrode by irradiating with laser light a part of the negative electrode above the foreign substance, a focal position of laser light is adjusted by irradiating with laser light normal pixel adjacent to the dead pixel.

In order to minimize a damage to a pixel, an ultra-short pulse laser such as a femtosecond laser is used as a laser for irradiating the pixel. Because the irradiation time of laser light is very short, a thermal damage can be suppressed. Laser light should pass a color filter, so laser light having wavelength of 800 nm or more that can pass the color filter is used.

A portion having a laser irradiation mark formed by irradiation of laser light or the periphery of the portion does not illuminate. Accordingly, it is necessary to reduce the irradiation diameter of laser light as small as possible. The diameter of laser light is narrowed by an objective lens and the like, and irradiation of laser light is conducted as a small spot. Laser light may be narrowed by selecting a suitable objective lens. The diameter of laser light may be narrowed so that a laser irradiation mark is formed to the extent that a non-luminous region by the laser irradiation mark can not be realized when the pixel is illuminated.

First irradiation of laser light is preferably performed in a state where the gap between the objective lens and the pixel is large. After the irradiation of laser light, if no laser irradiation mark is left, irradiation of laser light is conducted while gradually reducing the gap, and the gap is reduced until a laser irradiation mark is formed. After formation of a laser irradiation mark, a stage on which the organic EL element is moved along a predetermined direction, and a laser irradiation mark is formed by irradiating with laser light after the gap is further reduced by 1 μm. Further the stage is moved, and irradiation of laser light is conducted after the gap is reduced by 1 μm. Thus, irradiation of laser light is conducted while reducing the gap between the objective lens and the pixel by 1 μm, and this cycle is repeated until a laser irradiation mark is not formed.

After formation of an arrangement line of the dot-shaped laser irradiation marks, the pixel irradiated with the laser light is illuminated, and a non-luminous region of the laser irradiation mark is observed. It is observed that, at first, the area of the non-luminous region increases with a decrease in the gap between the objective lens and the pixel, and then, decreases with a further decrease in the gap between the objective lens and the pixel. First, if the focal position of laser light is adjusted on a negative electrode, the negative electrode is damaged or increases in electrical resistance. The region near the point irradiated with laser light becomes a non-luminous region. Corresponding to a decrease in the gap, the focal position of laser light is adjusted on the organic layer, and the organic layer is damaged. Thus, the area of the non-luminous region increases. When the gap is further reduced, the focal position of laser light is adjusted on a region under the organic layer, and the area of the non-luminous region is reduced. Finally, the focal position of laser light shifts away from the position to be processed, and a laser irradiation mark is not formed.

Figure 9A:
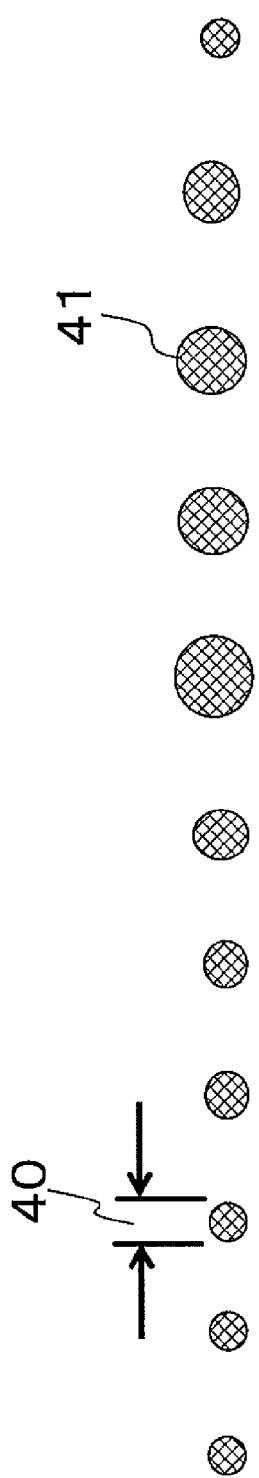
FIG. 9(a) is an external view of a laser processing state after irradiating a pixel with laser light while shifting the focal position of laser light according to Embodiment 1 of the invention.
Figure 9B:
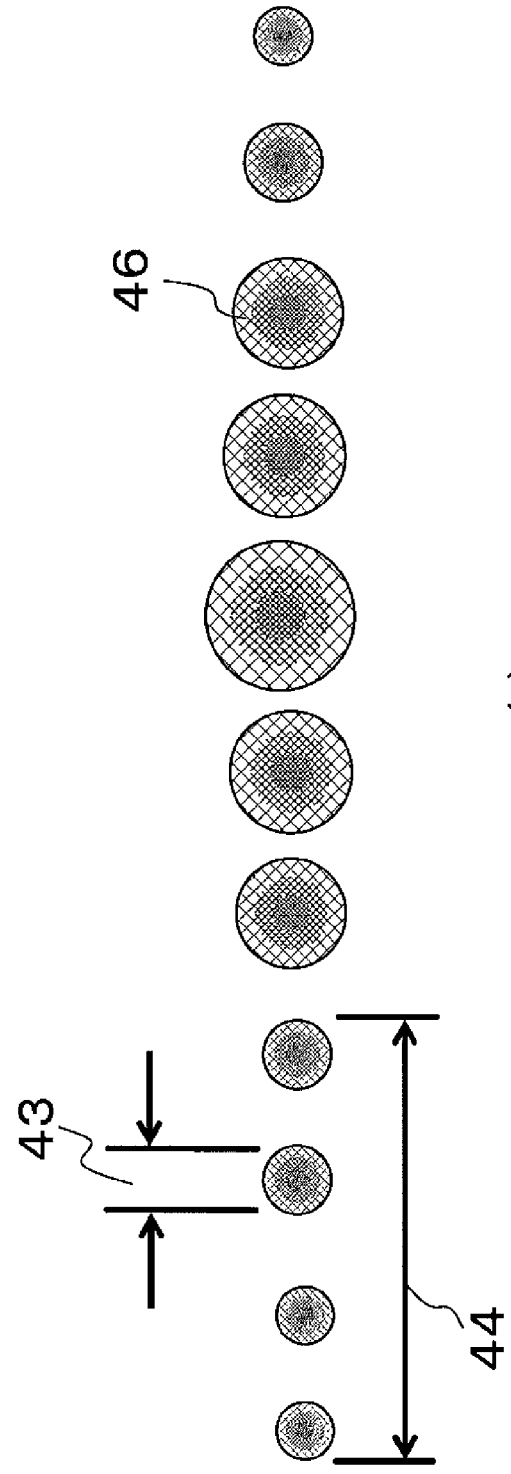
FIG. 9(b) is a diagram of non-luminous regions of a laser processing section when a pixel is illuminated after irradiating the pixel with laser light while shifting the focal position of laser light according to Embodiment 1 of the invention.

FIG. 9(*a*) illustrates dot 41 disposed along a line and formed by irradiation of laser light in a pixel adjacent to the dead pixel. The dots is formed by irradiating with laser light while reducing the gap between the objective lens and the pixel and shifting from left to right on the paper of FIG. 9.

FIG. 9(*b*) illustrates a state of non-luminous dot 46 (non-luminous region) when light is emitted from the pixel. As illustrated in FIG. 9(*b*), when the distance between the objective lens and the pixel is reduced, the area of the non-luminous region increases suddenly. If the non-luminous region has diameter 43 equal to or smaller by 1.5 times than diameter 40 of a laser irradiation mark (see reference numeral 44), it is determined that the focus of laser light is adjusted on the transparent electrode, and the focus of laser light at that time may be defined as focal position of laser light.

Figures 11A, 11B:
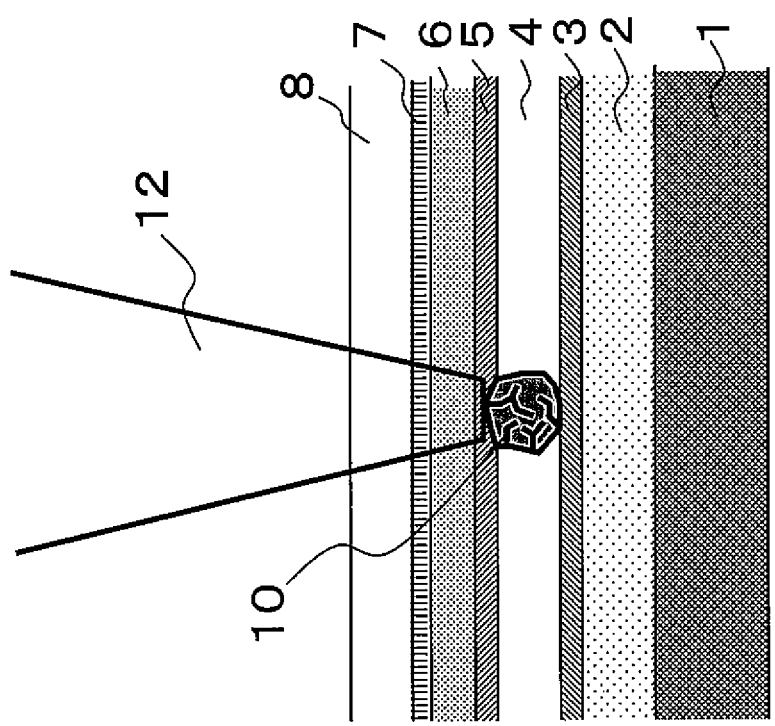
FIG. 11(a) is a cross-sectional view illustrating of irradiating with laser light a foreign substance contaminated into an organic layer.
FIG. 11(b) is a top view illustrating of irradiating with laser light a foreign substance contaminated into an organic layer.
Figures 12A, 12B:
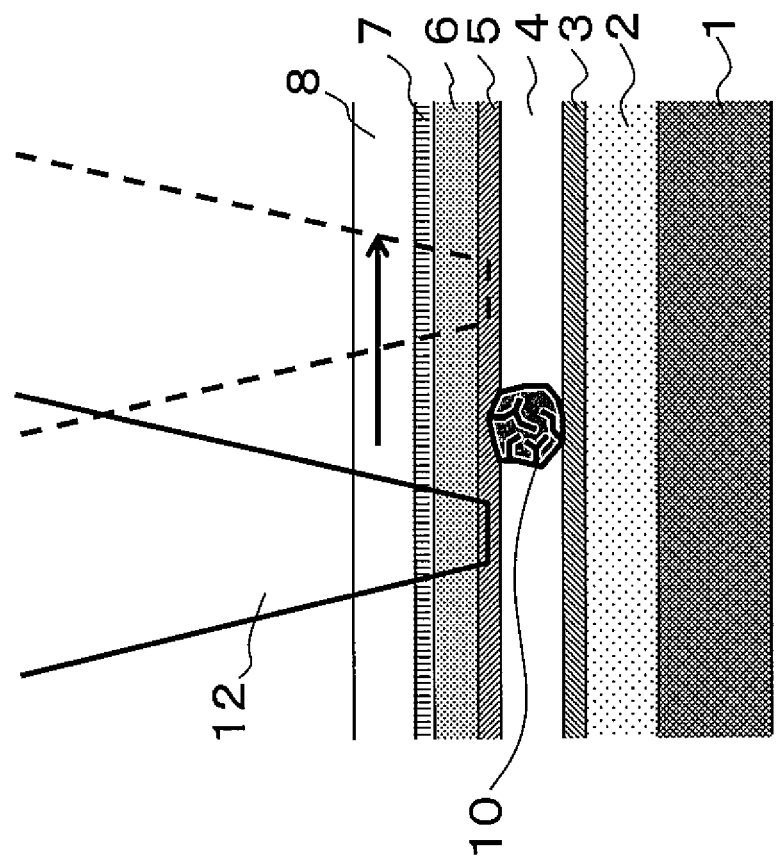
FIG. 12(a) is a cross-sectional view illustrating of irradiating with laser light an electrode around a foreign substance contaminated into an organic layer.
FIG. 12(b) is a top view illustrating of irradiating with laser light an electrode around a foreign substance contaminated into an organic layer.
Figure 13:
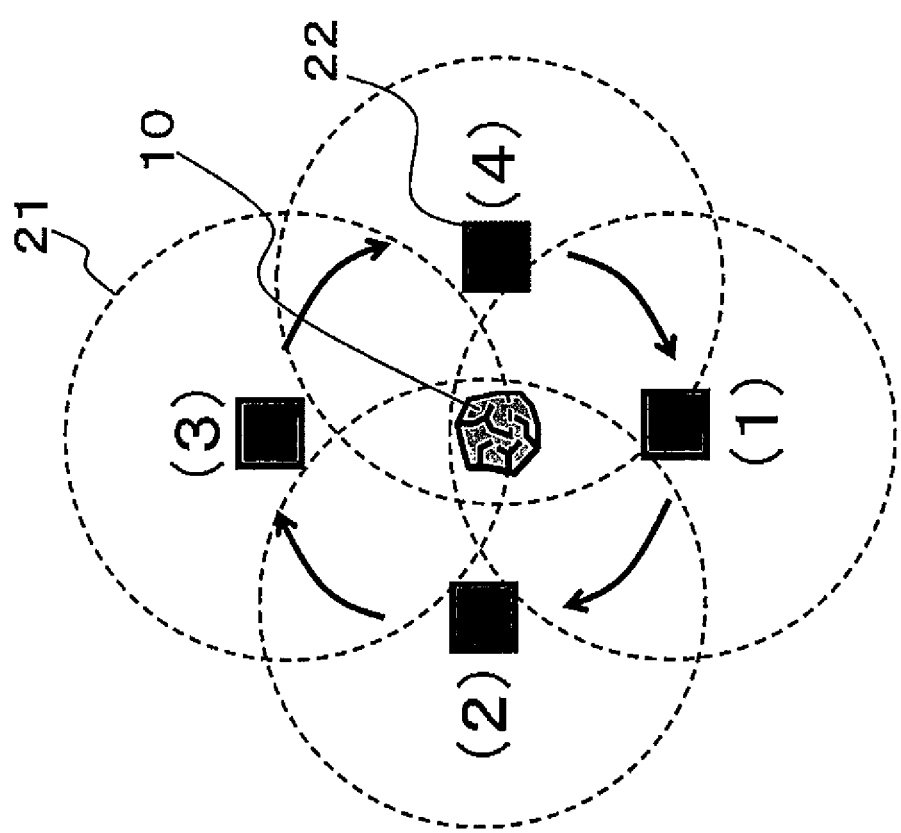
FIG. 13 is a top view illustrating of irradiating with low-energy laser light a portion around a foreign substance contaminated into an organic layer.
Figure 14:
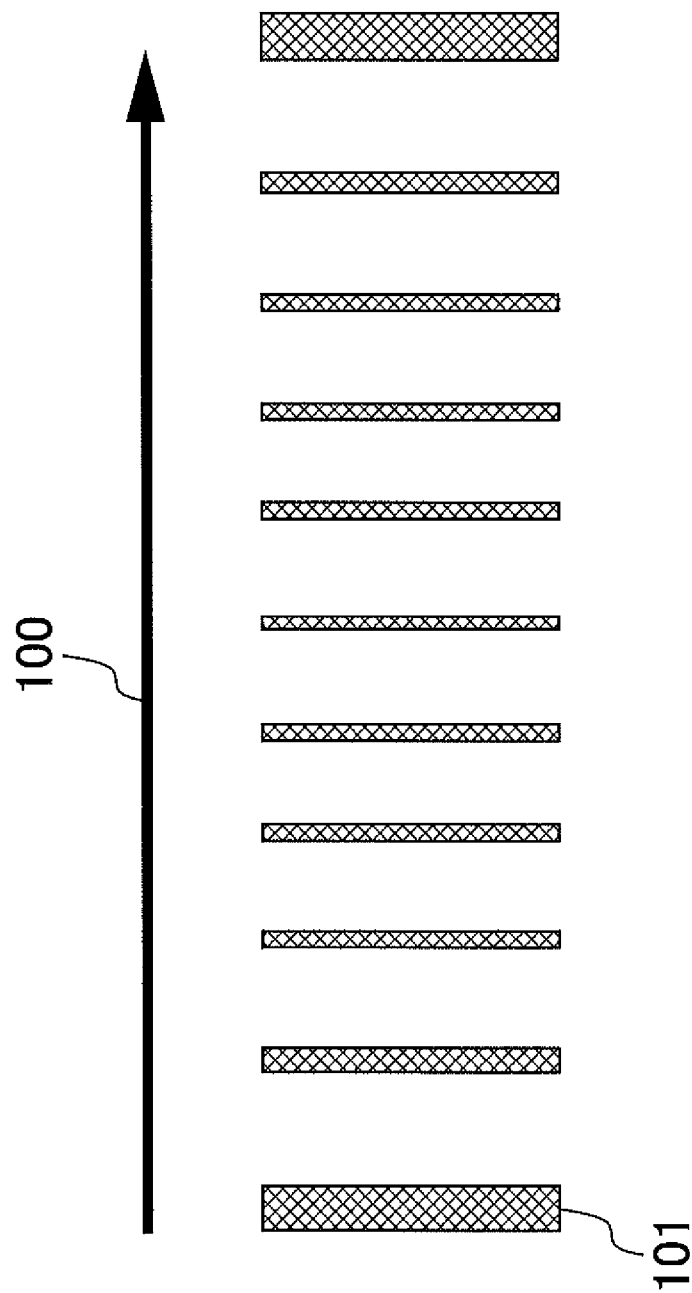
FIG. 14 is a diagram illustrating of forming line-shaped grooves while shifting the focus of a laser.

The focal position of laser light is adjusted as described above. In the fourth step, as illustrated in FIG. 11, a foreign substance is irradiated with the laser light so as to insulate a transparent electrode, thereby repairing a defect caused by the foreign substance. If the foreign substance is large, it may be preferable that the surrounding portion of the foreign substance is irradiated with the laser light as illustrated in FIG. 12. This is because the spread of defects is suppressed, since the foreign substance is damaged and destroyed by the laser light.

At this time, because the focal position of laser light is adjusted on the negative electrode, only the transparent negative electrode can be irradiated with the laser light without damaging the organic layer and the like.

Embodiment 2

In Embodiment 2, in the third step of Embodiment 1, a line-shaped laser irradiation mark is formed instead of the dot-shaped laser irradiation marks.

As in Embodiment 1, an irradiation of laser light is conducted in a state where a gap between an objective lens and a pixel is large. After irradiation of laser light, if no laser irradiation mark is left, an irradiation of laser light is conducted while reducing the gap until a laser irradiation mark is formed. After formation of a laser irradiation mark, irradiation of laser light is conducted while shifting the stage in a certain direction at a constant speed and reducing the gap between the objective lens and the pixel at a constant rate. A line-shaped irradiation mark is formed since the irradiation of the laser light is conducted while shifting the stage.

Figure 10A:
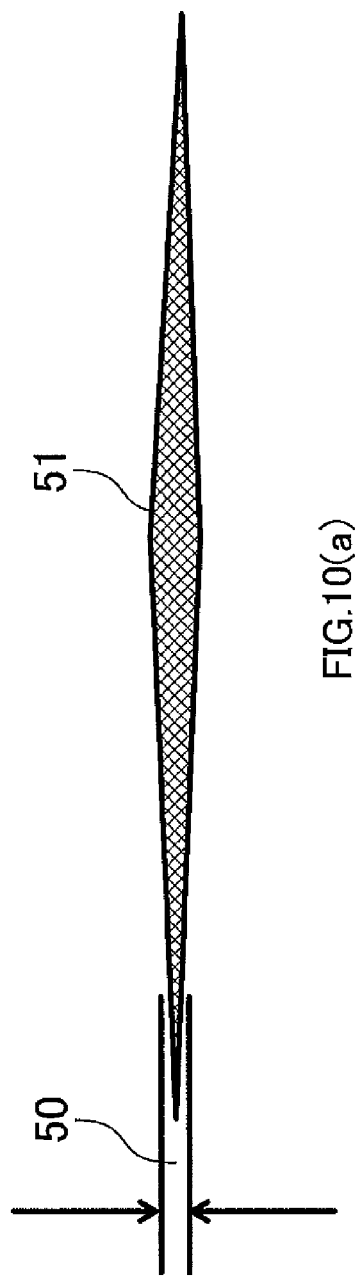
FIG. 10(a) is an external view of a laser processing state after irradiating a pixel with laser light while shifting the focal position of laser light according to Embodiment 2 of the invention.
Figure 10B:
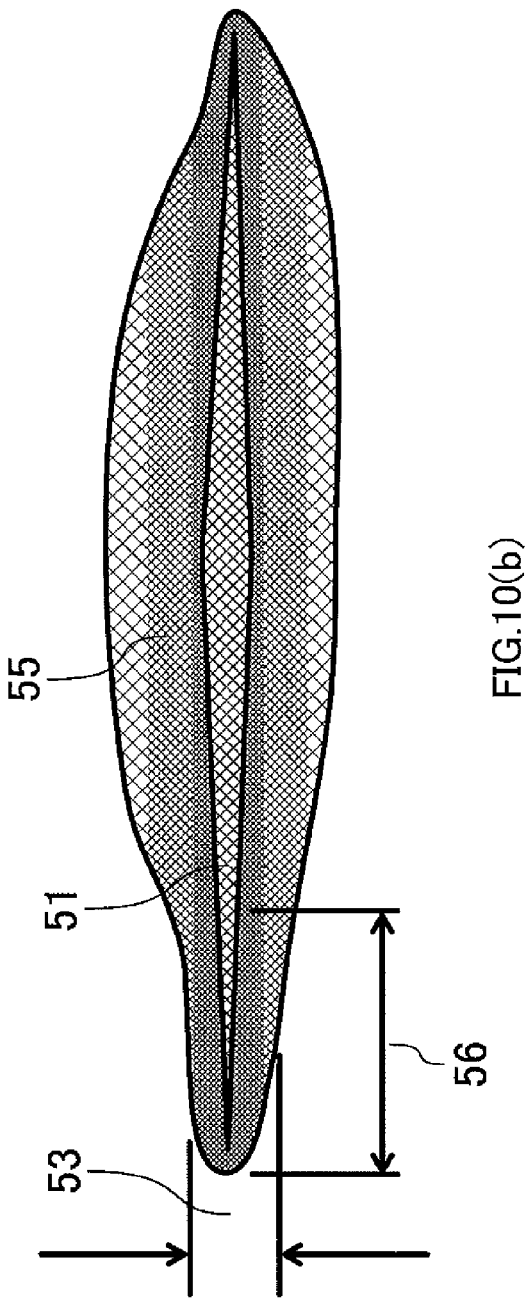
FIG. 10(b) is a diagram of a non-luminous regions of a laser processing section when a pixel is illuminated after irradiating the pixel with laser light while shifting the focal position of laser light according to Embodiment 2 of the invention.

FIG. 10(*a*) illustrates a state of irradiating with laser light while reducing the gap between the objective lens and the pixel at a constant rate and shifting the stage at a certain speed. As illustrated in FIG. 10(*a*), after line-shaped laser irradiation mark 51 is formed, the pixel irradiated with the laser light is illuminated, and the state of a non-luminous region with the line-shaped laser irradiation mark is observed.

FIG. 10(*b*) illustrates non-luminous region 55 when a pixel having a line-shaped laser irradiation mark is illuminated. As illustrated in FIG. 10, a line-shaped laser irradiation mark 51 is formed by irradiating with laser light while reducing a gap between an objective lens and a pixel from left to right to the paper of FIG. 10.

As illustrated in FIG. 10(*b*), with a decrease in the gap between the objective lens and then, the pixel, at first, width 53 of a non-luminous region increases suddenly, and width 53 of the non-luminous region decreases. This is caused by a change in the focal position of the laser light, as described in Embodiment 1. At this time, if the non-luminous region has a width equal to or smaller by 1.5 times than width 50 of the line-shaped laser irradiation mark (see reference numeral 56), it is determined that the focus of laser light is adjusted on the negative electrode, and the focus of the laser light at that time may be defined as the focal position of laser light.

Also, in Embodiment 2, since the focal position of the laser light is adjusted on the negative electrode, after adjusting the focal position of laser light, a foreign substance or a portion around the foreign substance is irradiated with laser light in the fourth step, and then a part of the negative electrode above the foreign substance region is insulated by irradiation of laser light. At this time, because the focal position of laser light is adjusted on the negative electrode, only the negative electrode can be irradiated with the laser light without damaging the organic layer and the like.

INDUSTRIAL APPLICABILITY

The method of manufacturing the organic EL display according to the invention can adjust the focal position of laser light, with which a defective section contaminated with a foreign substance or the electrode near the defective section is irradiated, when a laser repair is necessary because the defective section is formed in the organic layer. Thus according to the method of manufacturing an organic EL display of the invention, attenuation of luminance of illuminating pixels and power consumption can be reduced by the reduction of a leakage current without damage, and organic EL displays can be manufactured at a high yield rate.

Also, in addition to a method of manufacturing an organic EL display, the invention can also be applied to a method of manufacturing a device that requires a repair based on insulation by local irradiation of laser light.

REFERENCE SIGNS LIST

1 Circuit board
2 Insulating layer
3 Positive electrode
4 Organic layer
5 Negative electrode
6 Sealing layer
7 Color filter
8 Sealing glass
10 Foreign substance
12 Laser light
21 High-resistance region
22 Periphery of foreign substance
24 Dead pixel
25, 28 Adjacent pixels
26, 27 Portion where dot-shaped laser irradiation marks are formed
29 Focal position
30 Bank
40, 43 Diameter
41 Dot (laser irradiation mark)
44, 56 Non-luminous region by irradiation of the laser light whose focal positions are adjusted on transparent negative electrode
46 Dot (non-luminous region)
50 Width of laser irradiation mark
51 Laser irradiation mark
53 Width of non-luminous region
55 Non-luminous region
100 Arrow that represents size of a gap between the process target material and a laser head.
101 Groove

The invention claimed is:
1. A method of manufacturing an organic EL display, comprising:
   detecting a dead pixel in a panel of an organic EL display;
   detecting a foreign substance in the dead pixel;
   irradiating a pixel X disposed near the dead pixel with laser light so as to define a focal position of the laser light on a transparent electrode in the panel with reference to an area of a non-luminous region generated by irradiating the pixel X with the laser light; and irradiating the foreign substance in the dead pixel or a portion near the foreign substance with a laser light at the defined focal position.

2. The method according to claim 1, wherein:
in said irradiating pixel X, the pixel X is irradiated with the laser light while reducing a gap between an objective lens used for the laser light and the pixel X so as to form a laser irradiation mark in the pixel X.

3. The method according to claim 2, wherein:
in the pixel X which was irradiated with the laser light and has the laser irradiation mark,
a diameter of a non-luminous region generated by irradiating with the laser light is equal to or 1.5 times smaller than a diameter of the laser irradiation mark at a predetermined gap between the objective lens and the pixel, the predetermined gap being defined as a focal position of the laser light.

4. The method according to claim 2, wherein:
in said irradiating pixel X, a line-shaped laser irradiation mark is formed by irradiating with the laser light while sequentially reducing the gap between the objective lens and the pixel X.

5. The method according to claim 2, wherein:
in said irradiating pixel X, dot-shaped laser irradiation marks are formed by irradiating with the laser light at fixed periods while reducing the gap between the objective lens and the pixel X at constant intervals.

6. The method according to claim 1, wherein:
the pixel X is disposed either laterally adjacent to the dead pixel or longitudinally adjacent to the dead pixel.

\* \* \* \* \*